US006661292B2

(12) United States Patent
Gierl et al.

(10) Patent No.: US 6,661,292 B2
(45) Date of Patent: Dec. 9, 2003

(54) APPARATUS AND METHOD FOR DEMODULATING A RADIO DATA SYSTEM (RDS) SIGNAL

(75) Inventors: Stefan Gierl, Karlsruhe (DE); Christoph Benz, Ohlsbach (DE)

(73) Assignee: Harman/Becker Automotive Systems (Becker Division) GmbH, Karlsbad (DE)

(*) Notice: Subject to any disclaimer, the term of this patent is extended or adjusted under 35 U.S.C. 154(b) by 0 days.

(21) Appl. No.: 10/096,342

(22) Filed: Mar. 11, 2002

(65) Prior Publication Data

US 2002/0140515 A1 Oct. 3, 2002

(30) Foreign Application Priority Data

Mar. 10, 2001 (DE) ........................................ 101 11 590

(51) Int. Cl.$^{7}$ .................................................. H03L 7/00
(52) U.S. Cl. ....................................................... 331/1 A
(58) Field of Search ................................ 332/103, 119; 455/161.2, 180.3; 375/316, 327, 376; 331/1 A, 25

(56) References Cited

U.S. PATENT DOCUMENTS 5,473,290 A * 12/1995 Scomazzon et al. ........ 332/103
6,351,631 B1 * 2/2002 Noeske et al. .............. 455/260

FOREIGN PATENT DOCUMENTS

| | | | |
|---|---|---|---|
| DE | 3624529 | | 1/1988 |
| DE | 3627007 | | 2/1988 |
| DE | 3715571 | | 12/1988 |
| DE | 3823552 | | 1/1990 |
| DE | 4234603 | | 4/1994 |
| DE | 19847019 | | 4/2000 |
| EP | 1094627 | * | 4/2001 |

* cited by examiner

*Primary Examiner*—Tuan T. Lam
(74) *Attorney, Agent, or Firm*—Samuels, Gauthier & Stevens

(57) ABSTRACT

To demodulate the RDS signal, the stereo-multiplex signal is multiplied in a first branch by the in-phase component of an oscillator filtered by a low-pass filter while decimated in its sampling rate and filtered by a high-pass filter while in a second branch it is multiplied by the quadrature component of the oscillator filtered by a low-pass filter decimated in its sampling rate, and filtered by a high-pass filter. An error signal to control the oscillator is calculated from the high-pass-filtered signals and the RDS bit clock. A clock generator generating the RDS bit clock is controlled by the first high-pass-filtered signal and by the oscillator. An RDS decoder, to whose input the first high-pass-filtered signal is applied. and an arithmetic unit which calculates the error signal from the high-pass-filtered signals and from the PDS bit clock are both clocked by the clock generator. The RDS data are retrievable from the output of the RDS decoder.

29 Claims, 1 Drawing Sheet

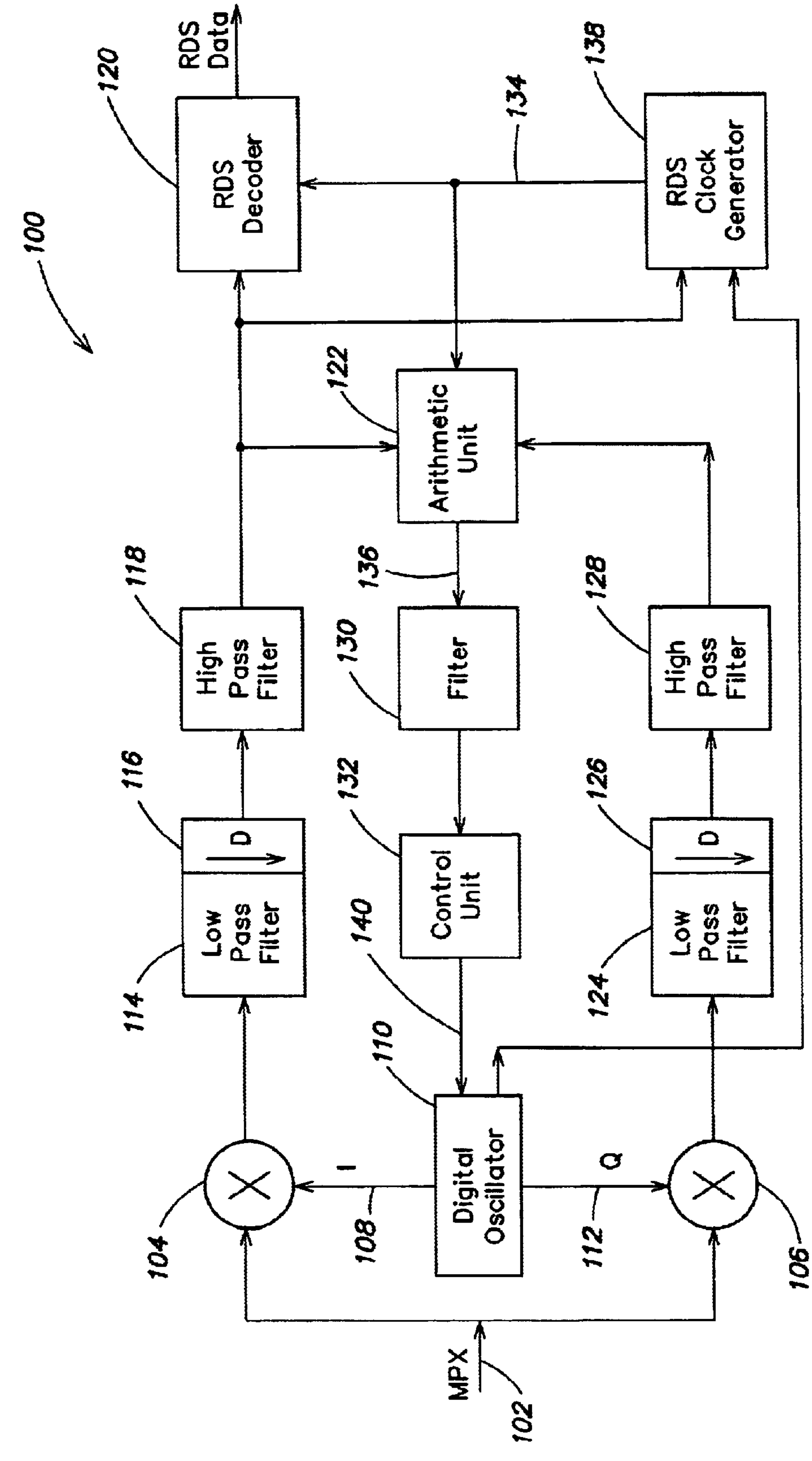
100
RDS Data
RDS Decoder
120
134
138
RDS Clock Generator
Arithmetic Unit
122
118
High Pass Filter
136
Filter
130
128
High Pass Filter
116
D
Low Pass Filter
114
132
Control Unit
140
126
D
Low Pass Filter
124
110
Digital Oscillator
I
Q
104
108
112
106
MPX
102

APPARATUS AND METHOD FOR DEMODULATING A RADIO DATA SYSTEM (RDS) SIGNAL

BACKGROUND OF THE INVENTION

The present invention relates to Radio Data System (RDS) signals broadcast with VHF radio transmissions, and in particular, to a method and circuitry for demodulating the RDS signal.

DESCRIPTION OF THE RELEVANT ART

The Radio Data System, or RDS, is a information broadcast that was introduced for use in FM radio stations which transmit stereo-multiplex signals in the VHF frequency band. The Radio Data System provides radio receivers with broadcast data about the transmitting radio station and the programs broadcast by the radio station. The radio receivers typically reproduce this data on an optical display such as a liquid-crystal display screen.

The RDS broadcast data may include: program identification (PI) which indicates the program being received or the name of the station/transmitter tuned in; program type identification (PTY) which indicates the type of program such as music, news, etc.; traffic announcements (TA); and/or radio text (RT) which contains program-accompanying information such as the music title, performer, program changes, and the like.

The Radio Data System is used principally in car radios. For example, when the reception of the transmitter currently tuned in deteriorates, RDS-capable car radios automatically switch over to a better, or best receivable, transmitter broadcasting the same program. The information required to do this is included in the noted program identification (PI) information along with a list of alternative frequencies (AF) which are being broadcast by RDS-capable radio stations. The Radio Data System also offers advantages to the listener of home FM receivers as well. For example, the home listener can benefit from the noted program type identification (PTY) and radio text (RT) information.

As noted, the VHF signal transmitted by FM radio stations is referred to as a stereo-multiplex signal. A stereo-multiplex signal includes the following components: an audio center (mono) signal at up to 15 kHz; a stereo pilot tone at 19 kHz; a stereo signal between 23 kHz and 53 kHz, and an ARI (Autofahrer-Rundfunk-Information-System (German), referred to as Motorist Information System in the United States) signal.

The ARI signal component is a narrowband amplitude-modulated signal with a carrier frequency of 57 kHz. The RDS signal is a binary signal that includes of a continuous binary data stream with a bit rate of 1.1875 Kbits/s. The RDS signal, which has a greater bandwidth than the ARI signal, is superimposed on the ARI signal. The RDS signal is generated from the RDS data stream by double-sideband modulation with carrier suppression. In addition, the suppressed RDS carrier is phase-shifted by 90° relative to the ARI carrier at 57 kHz. Because of this quadrature modulation, interference with the ARI signal by the RDS signal is essentially suppressed. In an RDS-capable radio transmitter, the carrier is frequency-modulated by the stereo-multiplex signal formed in the above-described manner and broadcast. To prevent the RDS signal from interfering with the other component signals such as the audio center signal, the stereo signal and the stereo pilot tone, while achieving a high data rate, the frequency spectrum of the RDS signal is typically restricted to ±2.4 kHz.

On the receiver side, the received frequency-modulated carrier is demodulated to obtain the stereo-multiplex signal from which the RDS signal as well as the audio signals are obtained.

One challenge for mobile FM receivers such as those installed in automobiles is that it can take a considerable amount of time before the tuner is synchronized to the 57 kHz carrier of the RDS signal due to constantly changing and often unsatisfactory reception conditions. Therefore, there is a need for a technique for demodulating the RDS signal such that fast synchronization with the carrier of the RDS signal is achieved.

SUMMARY OF THE INVENTION

Briefly, according to an aspect of the invention, a phase-locked loop circuit for demodulating a Radio Data System (RDS) signal superimposed on an ARI signal component of a stereo-multiplex signal is disclosed. The circuit comprises an oscillator that generates an in-phase component signal and a quadrature component signal of the carrier of the RDS signal, a first circuit branch comprising a first multiplier having a first input at which a sampled stereo-multiplex signal is received and a second input at which the in-phase component signal is received, a first low-pass filter having an input connected to an output of the first multiplier, a first divider having an input connected to an output of the first low-pass filter, and a first high-pass filter having an input connected to an output of the first divider; a second circuit branch comprising a second multiplier having a first input at which the sampled stereo-multiplex signal is received, and a second input at which the quadrature component signal is received, a second low-pass filter having an input connected to an output of the second multiplier, a second divider having an input connected to an output of the second low-pass filter, and a second high-pass filter having an input connected to an output of the second divider; a feedback branch comprising an arithmetic unit having first and second inputs connected to outputs of the first and second high-pass filters, respectively, a clock input at which an RDS bit clock signal is received, and an output at which the arithmetic unit generates an error signal; a filter having an input at which it receives the error signal, and an output at which it generates a filtered error signal; a control unit having an input connected to the filter output, and an output connected to a control input of the oscillator at which the control unit generates a control signal in response to the filtered error signal; a clock generator having a first control input connected to the output of the first high-pass filter, a second control input connected to an output of the oscillator, and an output at which the clock generator generates the RDS bit clock signal; and an RDS decoder having a first input connected to the output of the first high-pass filter, a clock input at which the RDS bit clock signal is received, and an output from which RDS data is retrievable.

Another aspect of the invention includes a method for demodulating a Radio Data System (RDS) signal superimposed on an ARI signal component of a stereo-multiplex signal. The method comprises generating an in-phase component signal and a quadrature component signal of the carrier of the RDS signal; multiplying a sampled stereo-multiplex signal by the in-phase component to generate a first product signal; low-pass filtering the first product signal to generate a first low-pass filtered signal; dividing a sampling rate of the first low-pass-filtered signal by a first presettable division factor to generate a decimated. filtered first product signal; high-pass filtering the decimated, filtered first product signal to generate a first high-pass-filtered signal; decoding the first high-pass filtered signal to generate RDS data; multiplying the sampled stereo-multiplex signal by the quadrature component to generate a second product signal; low-pass filtering the second product signal to generate a second low-pass filtered signal; dividing a sampling rate of the second low-pass-filtered signal by a second presettable division factor to generate a decimated, filtered second product signal; high-pass filtering the decimated, filtered second product signal to generate a second high-pass-filtered signal; calculating an error signal representing a phase difference between the carrier of the RDS signal and the output signal of an oscillator based on the first and second high-pass-filtered signals and an RDS clock signal, wherein the error signal represents a phase position between the carrier of the RDS signal and the output signal of the oscillator; and generating a correction signal for controlling the oscillator based on the error signal.

In a still further aspect of the invention, a phase-locked loop circuit for demodulating a Radio Data System (RDS) signal superimposed on an ARI signal component of a stereo-multiplex signal, the circuit comprising means for generating an in-phase component signal and a quadrature component signal of an RDS carrier signal in response to an oscillator control signal; means for generating a first product signal of a sampled stereo-multiplex signal and the in-phase component signal; means for generating a second product signal of a sampled stereo-multiplex signal and the quadrature component signal; means for controlling the oscillator based on the phase relationship between the RDS carrier signal and the signals generated by the oscillator; and means for generating RDS data based on the first high-pass filter.

These and other objects, features and advantages of the present invention will become more apparent in light of the following detailed description of preferred embodiments thereof, as illustrated in the accompanying drawings.

BRIEF DESCRIPTION OF THE DRAWING

The FIGURE is a schematic block diagram of one embodiment of a phase-locked loop (PLL) circuit.

DETAILED DESCRIPTION OF THE INVENTION

The FIGURE is a schematic block diagram of one embodiment of a phase-locked loop 100 (PLL). The PLL circuit 100 rapidly demodulates the RDS signal superimposed on the ARI signal of a received stereo-multiplex signal.

PLL circuit 100 receives a sampled stereo-multiplex signal 102 and processes the received signal 102 through two branches. The sampling frequency for sampling the stereo-multiplex signal 102 is selected such that the spectrum of the RDS signal is represented completely and correctly in the region of the 57 kHz carrier. Preferably, the sampling frequency for sampling the stereo-multiplex signal 102 is greater than 120 kHz. The sampled stereo-multiplex signal 102 is applied to a first input of a multiplier 104 of the first branch and to a multiplier 106 of the second branch. In-phase component 108 of a digital oscillator 110 is applied to a second input of the multiplier 104, while a quadrature component 112 of the digital oscillator 110 is applied to a second input of the multiplier 106.

The output of the multiplier 104 is connected to the input of a low-pass filter 114. The output of the low-pass filter 114 is connected to the input of a divider 116. The low-pass filter 114 generates a low-pass-filtered signal. The sampling rate of the low-pass filter is divided by a division factor described below in the divider 116. The resulting low-pass filter is decimated in the sampling rate. The output of the divider 116 is connected to the input of a high-pass filter 118, the output of which represents the end of the first branch, and is connected to the input of an RDS decoder 120 and to the first input of an arithmetic unit 122. The low-pass-filtered signal is filtered by the high-pass filter 118 and decoded in the RDS decoder 120.

In the second branch, the sampled stereo-multiplex signal 102 is multiplied by the quadrature component 112 of the digital oscillator 110 in the multiplier 106. The output of the multiplier 106 is connected to the input of a low-pass filter 124. The low-pass filter 124 filters the resulting product signal generated by the multiplier 106. The output of the low-pass filter 124 is connected to the input of a divider 126, which divides the sampling rate of the resulting low-pass-filtered signal. The output of the divider 126 is connected to the input of a high-pass filter 128. The high-pass filter 128 filters the decimated low-pass-filtered signal generated by the divider 126. The output of the high-pass filter 128 represents the end of the second branch and is connected to the second input of the arithmetic unit 122. The output of the arithmetic unit 122 is connected, via a filter 130, preferably a loop filter, to a control unit 132. The control unit 132 has an output connected to the control input of the digital oscillator 110.

An RDS bit clock signal 134 is generated by a clock generator 138 with a clock output that is connected to the clock input of the arithmetic unit 122 and the clock input of the RDS decoder 120. The output of the high-pass filter 118 is connected to the first input of the clock generator 138 while the output of the digital oscillator 110 is connected to the second input of the clock generator 138. The arithmetic unit 122 as well as the RDS decoder 120 are clocked by the clock generator 138.

Using the high-pass-filtered signal of the first and second branches as well as the RDS bit clock 134, the arithmetic unit 122 calculates an error signal 136 describing the phase deviation between the carrier of the RDS signal and the output signal of the oscillator 110. The control unit 132 generates a correction signal 140 based on the error signal 136 for controlling the digital oscillator 110.

Thus, the sampled stereo-multiplex signal 102 is multiplied in a first branch in the multiplier 104 by the in-phase component 108, then filtered in the low-pass filter 114, its sampling rate is divided in the following divider 116, and finally is filtered in the high-pass filter 118. In parallel, the sampled stereo-multiplex signal 102 is multiplied in the multiplier 106 by the quadrature component 112 then filtered in the low-pass filter 124; in the following divider 126, its sampling rate is divided and the resultant signal is high-pass-filtered in the high-pass filter 128.

The first and second division factors for decimating the sampling rate of the two low-pass-filtered signals are preferably selected such that the RDS signal is correctly represented in the baseband. In one embodiment, the first and second division factors are preferably 16 although other division factors can be implemented. The two high-pass filters 118 and 128 suppress low-frequency signal components which may be caused by an ARI signal contained in the stereo-multiplex signal 102. In one embodiment, the clock frequency of the RDS signal and the frequency of the digital oscillator 110 are each 57 kHz.

Since calculation of the error signal 136 in the arithmetic unit 122 is coupled to the RDS bit clock 134, the error signal 136 is calculated only at those times when the in-phase component 108 is at a maximum. This occurs after a quarter-bit clock period and a three-quarter-bit clock period. This measure ensures that a situation is avoided in which the error signal 136 is calculated by the arithmetic unit 122 at a point in time when the in-phase component 108 shows a zero crossing.

As long as the phase-locked loop is not yet synchronized with the carrier of the RDS signal, the clock generator 138 runs free. To preclude calculation of an error signal in the arithmetic unit 122 in the event of a zero crossing of the in-phase component 108 of the digital oscillator 110, the amplitude of the in-phase component is checked. During this initialization phase of carrier synchronization, the calculation cycle for the error signal may be shifted by a quarter clock period if a zero crossing is detected in the in-phase component 108. This measure ensures very rapid and reliable synchronization with the carrier of the RDS signal. A further advantage of the present invention is that it the above operations can be implemented as software.

Although the present invention has been shown and described with respect to several preferred embodiments thereof, various changes, omissions and additions to the form and detail thereof, may be made therein, without departing from the spirit and scope of the invention.

What is claimed is:

1. A phase-locked loop circuit for demodulating a Radio Data System (RDS) signal superimposed on an ARI signal component of a stereo-multiplex signal, the circuit comprising:

an oscillator that generates an in-phase component signal and a quadrature component signal of the carrier of the RDS signal;

a first circuit branch comprising a first multiplier having a first input at which a sampled stereo-multiplex signal is received and a second input at which the in-phase component signal is received, a first low-pass filter having an input connected to an output of the first multiplier, a first divider having an input connected to an output of the first low-pass filter, and a first high-pass filter having an input connected to an output of the first divider;

a second circuit branch comprising a second multiplier having a first input at which the sampled stereo-multiplex signal is received, and a second input at which the quadrature component signal is received, a second low-pass filter having an input connected to an output of the second multiplier, a second divider having an input connected to an output of the second low-pass filter, and a second high-pass filter having an input connected to an output of the second divider;

a feedback branch comprising an arithmetic unit having first and second inputs connected to outputs of the first and second high-pass filters, respectively, a clock input at which an RDS bit clock signal is received, and an output at which the arithmetic unit generates an error signal; a filter having an input at which it receives the error signal, and an output at which it generates a filtered error signal; a control unit having an input connected to the filter output, and an output connected to a control input of the oscillator at which the control unit generates a control signal in response to the filtered error signal;

a clock generator having a first control input connected to the output of the first high-pass filter, a second control input connected to an output of the oscillator, and an output at which the clock generator generates the RDS bit clock signal; and an RDS decoder having a first input connected to the output of the first high-pass filter, a clock input at which the RDS bit clock signal is received, and an output from which RDS data is retrievable.

2. The phase-locked loop circuit according to claim 1, wherein the filter comprises a loop filter.

3. The phase-locked loop circuit according to claim 1, wherein the sampling frequency for the stereo-multiplex signal is selected such that the spectrum of the RDS signal in the region around the carrier of the RDS signal is represented by the sampled stereo-multiplex signal.

4. The phase-locked loop circuit according to claim 3, wherein the sampling frequency is selected to be greater than 120 kHz.

5. The phase-locked loop circuit according to claim 1, wherein the first and second dividers divide the low-pass filtered signals presented at their respective inputs by a division factor of 16.

6. The phase-locked loop circuit according to claim 1, wherein the oscillator comprises a digital oscillator.

7. The phase-locked loop circuit according to claim 1, wherein the arithmetic unit calculates the error signal at those times when the amplitude of the in-phase component is at maximum.

8. The phase-locked loop circuit according to claim 1, wherein the oscillator is synchronized with the carrier of the RDS signal, wherein prior to synchronization, the arithmetic unit shifts the calculation cycle for the error signal by a quarter-bit clock period upon detection of a zero crossing of the amplitude of the in-phase component.

9. A method for demodulating a Radio Data System (RDS) signal superimposed on an ARI signal component of a stereo-multiplex signal, the method comprising:

generating an in-phase component signal and a quadrature component signal of the carrier of the RDS signal;

multiplying a sampled stereo-multiplex signal by the in-phase component to generate a first product signal;

low-pass filtering the first product signal to generate a first low-pass filtered signal;

decimating the first low-pass-filtered signal by a first presettable division factor to generate a decimated filtered first product signal;

high-pass filtering the decimated filtered first product signal to generate a first high-pass-filtered signal;

decoding the first high-pass filtered signal to generate RDS data;

multiplying the sampled stereo-multiplex signal by the quadrature component to generate a second product signal;

low-pass filtering the second product signal to generate a second low-pass filtered signal;

decimating the second low-pass-filtered signal by a second presettable division factor to generate a decimated; filtered second product signal;

high-pass filtering the decimated filtered second product signal to generate a second high-pass-filtered signal;

calculating an error signal representing a phase difference between the carrier of the RDS signal and the output signal of an oscillator based on the first and second high-pass-filtered signals and an RDS bit clock signal, wherein the error signal represents a phase difference between the carrier of the RDS signal and the output signal of the oscillator; and generating a correction signal for controlling the oscillator based on the error signal.

10. The method for demodulating a RDS signal according to claim 9, further comprising the step of:

filtering the error signal prior to using the error signal to generate the correction signal.

11. The method for demodulating a RDS signal according to claim 10, wherein the step of filtering the error signal comprises the step of:

filtering the error signal with a loop filter.

12. The method according to claim 9, further comprising the steps of:

selecting, prior to the step of generating in-phase and quadrature component signals, a sampling frequency for the stereo-multiplex signal such that the spectrum of the RDS signal in the region around the carrier of the RDS signal is represented by a digital signal.

13. The method according to claim 12, wherein the sampling frequency is selected to be greater than 120 kHz.

14. The method according to claim 9, wherein the first presettable division factor is 16.

15. The method according to claim 9, wherein the second presettable division factor is 16.

16. The method according to claim 9, wherein the oscillator includes a digital oscillator.

17. The method according to claim 9, wherein the RDS bit clock signal is generated by a clock generator in response to the oscillator and the first high-pass-filtered signal.

18. The method according to claim 17, wherein the step of decoding the first high-pass filtered signal to generate RDS data is performed by an RDS decoder that is clocked by the RDS bit clock signal.

19. The method according to claim 9, wherein the step of calculating the error signal is performed at those times when the amplitude of the in-phase component is at maximum.

20. The method according to claim 9, wherein the oscillator is synchronized with the carrier of the RDS signal, and wherein the step of calculating the error signal comprises the step of:

shifting the calculation cycle for the error signal by a quarter-bit clock period upon detection of a zero crossing of the amplitude of the in-phase component.

21. The method according to claim 9 wherein the method is implemented as a software program stored in a computer-readable medium.

22. A phase-locked loop circuit for demodulating a Radio Data System (RDS) signal superimposed on an ARI signal component of a stereo-multiplex signal, the circuit comprising:

oscillator means for generating an in-phase component signal and a quadrature component signal of an RDS carrier signal in response to an oscillator control signal;

means for generating a first product signal of a sampled stereo-multiplex signal and the in-phase component signal;

means for generating a second product signal of a sampled stereo-multiplex signal and the quadrature component signal;

means, responsive to a RDS clock signal and signals indicative of said first product signal and said second product signal, for providing said oscillator control signal to controll the oscillator means based on the phase relationship between the RDS carrier signal and the signals generated by the oscillator; and means, responsive to said RDS clock signal and a signal indicative of said first product signal, for generating RDS data.

23. The phase-locked loop circuit according to claim 22, wherein the means for generating a first product signal comprises:

means for multiplying the sampled stereo-multiplex signal by the in-phase component to generate the first product signal;

means for low-pass filtering the first product signal to generate a first low-pass filtered signal;

means for decimating the first product signal to generate a first decimated signal; and means for high-pass filtering the first decimated signal to generate the first product signal.

24. The phase-locked loop circuit according to claim 23, wherein the means for generating a second product signal comprises:

means for multiplying the sampled stereo-multiplex signal by the quadrature component to generate the second product signal;

means for low-pass filtering the second product signal to generate a second low-pass filtered signal;

means for decimating the second low-pass-filtered signal by a second presettable division factor to generate a second decimated signal; and means for high-pass filtering the second decimated signal to generate the second product signal.

25. The phase-locked loop circuit according to claim 22, wherein the means for controlling the oscillator comprises:

means for calculating an error signal representing a phase difference between the RDS carrier signal and the oscillator based on the first and second product signals, wherein the error signal represents a phase position between the RDS carrier signal and the output signal of the oscillator; and means for generating the oscillator control signal based on the error signal.

26. The phase-locked loop circuit according to claim 22, wherein the sampling frequency for the stereo-multiplex signal is selected such that the spectrum of the RDS signal in the region around the carrier of the RDS signal is represented by the sampled stereo-multiplex signal.

27. The phase-locked loop circuit according to claim 24, wherein the first and second decimators divider the first and second low-pass filtered signals respectively by a division factor of 16.

28. The phase-locked loop circuit according to claim 25, wherein said means for calculating an error signal comprises an arithmetic unit that calculates the error signal when the amplitude of the in-phase component is at maximum.

29. The phase-locked loop circuit according to claim 25, wherein the oscillator means is synchronized with the carrier of the RDS signal, wherein prior to synchronization the means for generating an error signal shifts the calculation cycle for the error signal by a quarter-bit clock period upon detection of a zero crossing of the amplitude of the in-phase component.

* * * * *